(12) United States Patent
Kim et al.

(10) Patent No.: US 8,525,154 B2
(45) Date of Patent: Sep. 3, 2013

(54) LIGHT-EMITTING DEVICE HAVING OPTICAL RESONANCE LAYER

(75) Inventors: Yoon-Chang Kim, Suwon-si (KR); Young-Woo Song, Suwon-si (KR); Sang-Hwan Cho, Suwon-si (KR); Ji-Hoon Ahn, Suwon-si (KR); Joon-Gu Lee, Suwon-si (KR); So-Young Lee, Suwon-si (KR); Jong-Seok Oh, Suwon-si (KR); Jae-Heung Ha, Suwon-si (KR)

(73) Assignee: Samsung Display Co., Ltd., Yongin (KR)

( * ) Notice: Subject to any disclaimer, the term of this patent is extended or adjusted under 35 U.S.C. 154(b) by 1615 days.

(21) Appl. No.: 11/269,575

(22) Filed: Nov. 9, 2005

(65) Prior Publication Data
US 2006/0097264 A1 May 11, 2006

(30) Foreign Application Priority Data
Nov. 10, 2004 (KR) .......... 10-2004-091490

(51) Int. Cl.
H01L 29/04 (2006.01)

(52) U.S. Cl.
USPC 257/40; 257/72; 257/E33.002; 257/E33.055; 313/504

(58) Field of Classification Search
USPC .......... 313/504; 257/40, E33.055, E33.002
See application file for complete search history.

(56) References Cited

U.S. PATENT DOCUMENTS

| 5,814,416 | A | * | 9/1998 | Dodabalapur et al. ........ 428/690 |
| 5,920,080 | A | | 7/1999 | Jones |
| 7,098,590 | B2 | | 8/2006 | Lim et al. |
| 7,416,917 | B2 | * | 8/2008 | Ko ................................. 438/99 |
| 2003/0071567 | A1 | * | 4/2003 | Eida et al. ..................... 313/504 |
| 2004/0104398 | A1 | | 6/2004 | Hon et al. |

FOREIGN PATENT DOCUMENTS

| EP | 0654833 A1 | 5/1995 |
| EP | 1401034 A2 | 3/2004 |
| EP | 1450419 A2 | 8/2004 |
| JP | 1987-62-172691 | 7/1987 |
| JP | 1988-63-172691 | 7/1988 |
| JP | 1989 1-220394 | 9/1989 |
| JP | 07-320864 | 12/1995 |
| JP | 08-008061 | 1/1996 |
| JP | 1996-8-213174 | 8/1996 |
| JP | 08-250786 | 9/1996 |
| JP | 1996-8-250786 | 9/1996 |
| JP | 1998-10-177896 | 6/1998 |
| JP | 11-224783 A1 | 8/1999 |

(Continued)

OTHER PUBLICATIONS

European Search Report, issued Feb. 2, 2006.

*Primary Examiner* — Lynne Gurley
*Assistant Examiner* — Vernon P Webb
(74) *Attorney, Agent, or Firm* — H.C. Park & Associates, PLC

(57) ABSTRACT

Provided is a light-emitting device which has a simple structure and can be manufactured in a simple process, has increased light coupling efficiency and brightness, and can reduce adverse effects of optical resonance on a view angle and emission spectrum. The light-emitting device includes a substrate; a light-emitting diode formed on the substrate; and an optical resonance layer formed outside the light-emitting diode that induces resonance of light emitted from the light-emitting diode.

15 Claims, 12 Drawing Sheets

(56) References Cited

FOREIGN PATENT DOCUMENTS

| | | |
|---|---|---|
| JP | 1999 11-283751 | 10/1999 |
| JP | 2001-071558 | 3/2001 |
| JP | 2003-508876 | 3/2003 |
| JP | 2003-123987 | 4/2003 |
| JP | 2004-111398 | 4/2004 |
| JP | 2004-182491 | 7/2004 |
| WO | 99-53578 | 10/1999 |

* cited by examiner

LIGHT-EMITTING DEVICE HAVING OPTICAL RESONANCE LAYER

CROSS REFERENCE TO RELATED APPLICATION

This application claims priority to and the benefit of Korean Patent Application No. 10-2004-0091490, filed on Nov. 10, 2004, which is hereby incorporated by reference for all purposes as if fully set forth herein.

BACKGROUND OF THE INVENTION

1. Field of the Invention

The present invention relates to a light-emitting device, and more particularly, to a light-emitting device having an optical resonance layer that provides increased light coupling efficiency.

2. Description of the Related Art

Light-emitting efficiency of light-emitting devices, and in particular, flat panel displays such as liquid crystal displays (LCDs) and electroluminescent (EL) devices, is classified into internal efficiency and external efficiency. Internal efficiency depends upon photoelectric conversion efficiency of organic light-emitting materials. External efficiency, also referred to as light coupling efficiency, depends on refractive indices of the layers constituting an organic light-emitting diode (OLED). Since OLEDs have lower light coupling efficiency than other displays, such as cathode ray tubes (CRTs) or plasma display panels (PDPs), their display characteristics, such as brightness, lifetime, etc. must be improved.

The primary reason why OLEDs have lower light coupling efficiency than other displays is that when light is emitted from an organic layer in the OLEDs at an angle greater than a critical angle, total internal reflection occurs at an interface between a higher refractive-index layer, such as an ITO electrode layer, and a lower refractive-index layer, such as a substrate, thereby preventing the light from being emitted outside of the OLEDs. Thus, due to the total internal reflection at the interface, only about ¼ of the light emitted from the organic light-emitting layer may be emitted outside of the OLEDs.

Japanese Laid-Open Patent Publication No. Sho 63-172691 describes an OLED for preventing reduction of light coupling efficiency. The OLED includes a substrate capable of collecting light, such as a projection lens. However, such a projection lens cannot be easily formed on a substrate since pixels for the emission of the organic layer are very small.

Japanese Laid-Open Patent Publication No. Sho 62-172691 describes an OLED in which a first dielectric layer is interposed between a transparent electrode layer and a light-emitting layer, and a second dielectric layer is formed on the transparent electrode layer, the second dielectric layer having a refractive index corresponding to about an average of a refractive index of the first dielectric layer and a refractive index of the transparent electrode layer.

Japanese Laid-Open Patent Publication No. Hei 1-220394 describes an OLED of which a bottom electrode, an insulating layer, a light-emitting layer, and a top electrode are formed on a substrate and a mirror for reflecting light is formed on a sidewall of a light-emitting layer.

However, since the light-emitting layer is very thin, it is very difficult to install the mirror on the sidewall and thus, its installation may increase production costs.

To overcome these problems, Japanese Laid-Open Patent Publication No. Hei 11-283751 describes an organic light-emitting device having an organic layer or multi-organic layers interposed between an anode electrode and a cathode electrode and having diffraction lattices and a zone plate as constitutional elements. Light emitted from the organic layer can be extracted due to light scattering obtained by forming the diffraction lattices near an interface between layers having refractive indices different from each other. However, a production process of the diffraction lattice layer is complicated and since a surface of the diffraction lattice layer is curved, a thin layer formed on the diffraction layer cannot be easily patterned and a separate planarization process for filling curved portions of the surface is required.

Japanese Laid-Open Patent Publication Nos. Hei 8-250786, 8-213174, and 10-177896 describe OLEDs using a concept of optical microcavity.

The OLEDs have multi-layered translucent mirrors interposed between a glass substrate and an ITO electrode and the translucent mirrors together with a metal cathode electrode, which functions as a reflective layer, function as optical resonators. The translucent mirrors are formed by multi-layering a $TiO_2$ layer having a high refractive index and a $SiO_2$ layer having a low refractive index in turn. A reflectance can be controlled by varying the number of layer in the multi-layer and thus the optical cavity can be generated. As the number of layers constituting the translucent mirrors increases, the reflective property is improved. However, to control a reflectance of light having a specific wavelength, the number and thickness of the layers to be layered must be accurately chosen. Thus, the production process of an OLED is complicated. The OLEDs have high brightness and high color purity, but small view angle and narrow spectrum.

In full color displays, a thickness of a layer and a depth of cavity, etc., must vary according to red, green, and blue colors. Thus, the production process is complicated and the production costs are high.

SUMMARY OF THE INVENTION

This invention provides a light-emitting device which has a simple structure and can be manufactured in a simple process, has increased light coupling efficiency and brightness, and can reduce adverse effects of optical resonance on view angle and emission spectrum.

Additional features of the invention will be set forth in the description which follows, and in part will be apparent from the description, or may be learned by practice of the invention.

The present invention discloses a light-emitting device including a substrate, a light-emitting diode arranged on the substrate, an optical resonance layer separate from the light-emitting diode and inducing resonance of light emitted from the light-emitting diode, and an interlayer arranged between the optical resonance layer and the light-emitting diode.

The present invention also discloses a light-emitting device including a substrate, a light-emitting diode arranged on the substrate, an optical resonance layer arranged between the light-emitting diode and the substrate and inducing resonance of light emitted from the light-emitting diode, and an interlayer arranged between the optical resonance layer and the light-emitting diode.

The present invention also discloses a light-emitting device including a substrate, a light-emitting diode arranged on the substrate, an optical resonance layer arranged on the light-emitting diode and inducing resonance of light emitted from the light-emitting diode, and an interlayer arranged between the optical resonance layer and the light-emitting diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
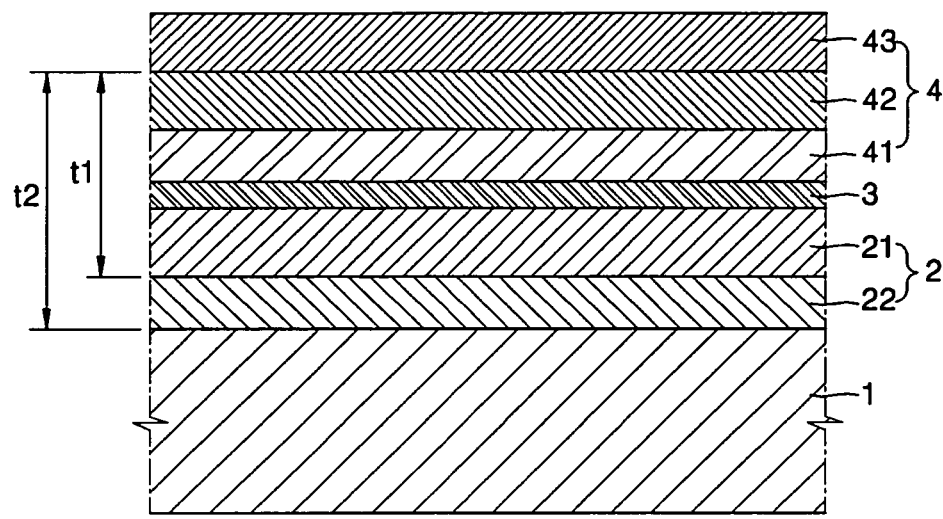
FIG. 1 shows a schematic cross-sectional view of a bottom emission type organic light-emitting device according to an embodiment of the present invention.
Figure 1:

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 shows a schematic cross-sectional view of an organic light-emitting device according to an embodiment of the present invention.

Referring to FIG. 1, the organic light-emitting device comprises a substrate 1 which is composed of a transparent material, an optical resonance layer 2 formed on the substrate 1, an interlayer 3 formed on the optical resonance layer 2, and a light-emitting diode 4 formed on the interlayer 3. An encapsulation part (not shown), for example glass, a film, or a metal cap which encapsulates the light-emitting diode 4 to block the light-emitting diode 4 from the outside 10 may be further formed on the light-emitting diode 4. Hereinafter, schematic structures of organic light-emitting devices in which the encapsulation parts are omitted will be explained in the following embodiments of the present invention.

The substrate 1 may be made of transparent glass which comprises $SiO_2$ as a primary component. The organic light-emitting device may further comprise a buffer layer (not is shown) on the transparent substrate 1 in order to make a surface of the substrate 1 smooth and prevent penetration of element impurities. The buffer layer may be made of $SiO_2$ and/or $SiN_x$, etc. The substrate 1 may be made of transparent plastics, not being limited to the above-mentioned material.

The light-emitting diode 4 comprises a first electrode layer 41 and a second electrode layer 43 disposed opposite to each other and a light-emitting layer 42 interposed between the first electrode layer 41 and the second electrode layer 43.

The first electrode layer 41 may be made of a transparent conductive material, for example indium tin oxide (ITO), indium zinc oxide (IZO), $In_2O_3$, and ZnO, and have a predetermined pattern using a photolithographic method. The first electrode layer 41 may be patterned in a shape of strips which are separated from each other by a predetermined distance in case of a passive matrix (PM) type organic light-emitting device or in a shape corresponding to pixels in case of an active matrix (AM) type organic light-emitting device. The AM type device further comprises a thin film transistor (TFT) layer having at least one TFT on the substrate 1 below the first electrode layer 41 and the first electrode layer 41 is electrically connected to the TFT layer. Exemplary embodiments regarding the PM and AM type devices will be described in detail later.

The first electrode layer 41 may be connected to an external terminal (not shown) and function as an anode electrode.

The second electrode layer 43 is formed above the first electrode layer 41. The second electrode layer 43 may be a reflective electrode and made of, for example,aluminium, silver, or calcium. The second electrode layer 43 may be connected to a second external electrode terminal (not shown) and function as a cathode electrode.

The second electrode layer 43 may be formed in a shape of strips which are perpendicular to the pattern of the first electrode layer 41 in case of the PM type device or in a shape corresponding to pixels in case of the AM type device. In case of the AM type device, the second electrode layer 43 may be formed covering all the regions in which images are realized.

Exemplary embodiments regarding the PM and AM type devices will be described in detail later.

The light-emitting layer 42, which is interposed between the first electrode layer 41 and the second electrode layer 43, emits light by electrical driving of the first electrode layer 41 and the second electrode layer 43. A light-emitting device is classified into an organic light-emitting device or an inorganic light-emitting device according to the type of the light-emitting layer 42.

In the organic light-emitting device, the light-emitting layer 42 can be made of a small molecular organic material or a polymer material.

When the light-emitting layer 42 is a small molecular organic layer made of a small molecular organic material, the light-emitting layer 42 may have a structure in which a hole transport layer and a hole injection layer are layered on an organic emission layer (EML) in a direction to the first electrode 41, and an electron transport layer and an electron injection layer are layered on the EML in a direction to the second electrode layer 43. In addition to the hole transport layer, the hole injection layer, the electron transport layer, and the electron injection layer, other layers may also be layered.

Examples of the small molecular organic material which can be used include, but are not limited to, copper phthalocyanine (CuPc), N,N'-di(naphthalene-1-yl)-N,N'-diphenyl-benzidine (NPB), and tris-8-hydroxyquinoline aluminum (Alq3).

When the light-emitting layer 42 is a polymer organic layer made of the polymer is material, the light-emitting layer 42 may have a structure in which only a hole transport layer is layered on an EML in a direction to the first electrode 41. The polymer hole transport layer can be formed on the first electrode layer 41 using, for example, inkjet printing or spin coating using poly-(2,4)-ethylene-dihydroxy thiophene (PEDOT) or polyaniline (PANI), etc. Examples of the high molecular weigh organic material include, but are not limited to, poly(p-phenylenevinylene) (PPV), soluble PPV's, cyano-PPV, and polyfluorene. Color patterns may be formed using conventional methods, such as inkjet printing, spin coating, or thermal transfer method using a laser.

In the inorganic light-emitting device, the light-emitting layer 42 may be made of alkali earth potassium sulfides, for example, ZnS, SrS, CaS, $CaCa_2S_4$, $SrCa_2S_4$, $BaAl_2S_4$ and emission center elements, such as transtion metal or alkali earth metal, for example Mn, Ce, Th, Eu, Tm, Er, Pr, Pb, and insulating layers are interposed between the light-emitting layer 42 and the first electrode layer 41 and between the light-emitting layer 42 and the second electrode layer 43.

In the embodiment illustrated in FIG. 1, light from the light-emitting layer 42 of the light-emitting diode 4 is emitted in the direction indicated by the arrow illustrated in FIG. 1, toward the substrate 1.

In the embodiment illustrated in FIG. 1, an optical resonance layer 2, which induces resonance of light emitted from the light-emitting diode 4, is interposed between the substrate 1 and the light-emitting diode 4. An interlayer 3 is shown as interposed between the optical resonance layer 2 and the light-emitting diode 4. However the invention includes such embodiments where an interlayer 3 is not interposed between the optical resonance layer 2 and the light-emitting diode 4.

The optical resonance layer 2 comprises a first layer 21 and a second layer 22, sequentially layered in a direction away from the light-emitting diode 4.

The second layer 22 has a higher refractive index than the first layer 21. The second layer 22 can have a refractive index higher than the refractive index of the first layer 21 by about 0.2 or more.

The first layer 21 may have a refractive index of about 1.0 to about 1.6. The first layer 21 may be made of nano porous silica (NPS), siloxane, magnesium fluoride ($MgF_2$), calcium fluoride ($CaF_2$), silica aero gel, silicon oxide ($SiO_2$), or a synthetic resinous fluorine-containing polymer sold under the trademark TEFLON®.

The NPS has a plurality of pores and may absorb moisture and oxygen while maintaining its transparency. Since absorbed moisture can adversely affect the lifetime of the organic light emitting device, the NPS layer can be hydrophobic.

The NPS layer can be produced using various methods. One method is described below.

First, a first mixture is obtained by mixing 0.3 g of a surfactant with 0.6 g of a solvent. The surfactant is a polymer and the solvent is a mixture of propanol and butanol in a mixing ratio of 1:2. A second mixture is obtained by mixing 5 g of tetra-ethyl-ortho-silicate (TEOS), 10.65 g of a solvent, and 1.85 g of HCl.

The second mixture is stirred for about one hour and a third mixture is obtained by mixing 2.1 g of the second mixture with the first mixture. Then, the third mixture is coated on a substrate. Coating is performed, for example, with spin coating, spray coating, or roll coating. Spin coating is performed at 2000 rpm for about 30 seconds. Then, the coated substrate is aged at room temperature for about 24 hours or at between 40° C. and 50° C. for about 5 hours. In order to form pores for absorbing moisture, the aged substrate is baked in an oven at 400° C. for about 2 hours, thereby burning the polymer. The obtained NPS layer has a thickness of about 100 nm to 400 nm. The above process can be repeated to form a thin film having a desired thickness. The quantities of the materials described above are disclosed to represent ratios of the materials and can be adjusted proportionally to produce desired quantities of the NPS layer.

In another method, ammonia ($NH_{40}H$) is added to 30 g of $H_2O$ to make the water basic, to which 10 g of tetraethyl ortho silicate (TEOS) is added. The resultant mixture is hydrolyzed and polycondensated by heating it for about 3 hours or more while stirring. Then, an acid, for example, an organic acid or an inorganic acid, is added to the resultant solution.

To increase its stability, 13.2 g of 30% by weight water-soluble acrylic resin is added to the resultant mixture and stirred, thus obtaining a uniform solution.

The uniform solution is coated on a substrate and roll coating is performed at 180 rpm for 120 seconds, and then, the coated substrate is dried in a dry oven for about 2 minutes to remove a residual solvent from the coating. The above process may be repeated to increase the thickness of the obtained film.

The resultant product may be heated at 500° C. for about 30 minutes to remove the polymer and the organic material and cure the silica. The quantities of the materials described above are disclosed to represent ratios of the materials and can be adjusted proportionally to produce desired quantities of the NPS layer.

The NPS layer obtained contains pores. The pores generally have a size of about 1 nm to about 50 nm. The size of the pores can be controlled by adjusting the size of the polymer used in the first mixture. A pore density can be about 80%. The NPS layer may be formed using, for example, spin coating, spray coating, or roll coating, described above.

The second layer 22 can have a refractive index of about 1.6 to about 2.3. The second layer 22 may be made of, for example, silicon nitride ($Si_3N_4$), titanium oxide ($TiO_2$), hafnium dioxide ($HfO_2$), niobium oxide ($Nb_2O_5$), tantalum oxide ($Ta_2O_5$), antimony oxide ($Sb_2O_3$), synthetic polymer, or benzocylobutene (BCB).

The interlayer 3 may be made of material which has a refractive index between the refractive index of the first layer 21 and the refractive index of the second layer 22. The interlayer 3 may have a refractive index of about 1.3 to about 2.3. The interlayer 3 may be made of silicon oxide ($SiO_2$), BCB, silicon nitride ($Si_3N_4$), or a hybrid inorganic-organic polymer sold under the trademark ORMOCER®. The material used in manufacturing interlayer 3 may be a denser material than the material used to manufacture the first layer 21. Although all embodiments shown in the figures and described herein include the interlayer, the interlayer is an optional layer and may be left out of any embodiment of the invention.

The optical resonance layer 2 induces optical resonance of the light emitted from the light-emitting layer 42. Referring to FIG. 1, the optical resonance is generated between a bottom surface of the second electrode layer 43 and an interface, the interface being between the first layer 21 made of a low refractive index material and the second layer 22 made of a high refractive index material, and further, between the bottom surface of the second electrode layer 43 and an interface, the interface being between the second layer 22 and the substrate 1.

Due to the optical resonance, the light emitted from the light-emitting layer 42 of the light-emitting diode 4 can be easily extracted to the outside of the display, thereby increasing light-emitting efficiency. The optical resonance is generated on an outside of the light-emitting diode 4 and a view angle is controlled by adjusting reflectance of the resonance surface.

Referring to FIG. 1, resonance thicknesses are designated by t1 and t2 that can be obtained from the following equations:

$$t1=(n\lambda)/2,$$

$$t2=(2n+1)\lambda/4,$$

wherein t1 is a distance from the bottom surface of the second electrode layer 43 to the interface between the first layer 21 and the second layer 22;

t2 is a distance from the bottom surface of the second electrode layer 43 to the interface between the second layer 22 and the substrate 1;

n is a positive integer; and $\lambda$ is a wavelength of light emitted from the light-emitting layer 42.

t1 may be controlled by adjusting a thickness of at least one of the first layer 21 and the interlayer 3, and t2 may be controlled by adjusting a thickness of the second layer 22.

In an embodiment of the present invention, the interlayer 3 functions as a passivation layer which is interposed between the optical resonance layer 2 and the light-emitting diode 4 and prevents oxygen and moisture in the substrate 1 from penetrating into the light-emitting diode 4 or planarizes the surface of the optical resonance layer 2. In addition to these functions, the interlayer 3 may have other functions. For example, optical resonance can occur due to total reflection at an interface between the interlayer 3 and the first layer 21 which has a low refractive index.

Figure 2:
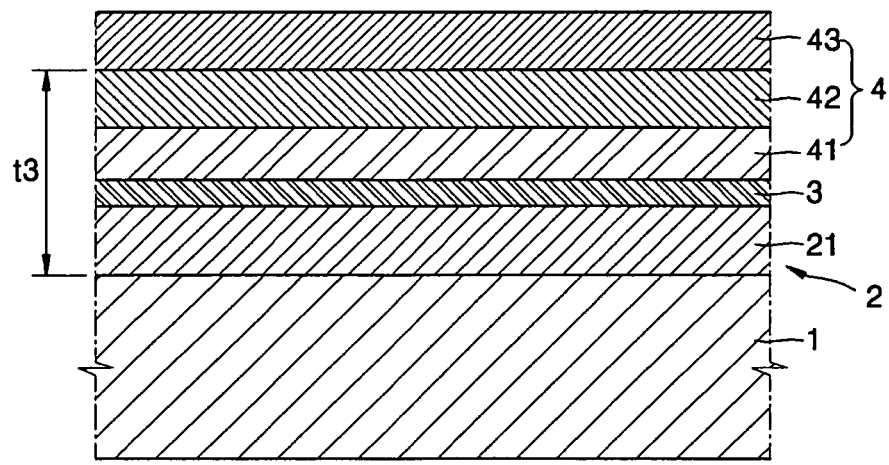
FIG. 2 shows a schematic cross-sectional view of a bottom emission type organic light-emitting device according to another embodiment of the present invention.
Figure 2:

According to an embodiment illustrated in FIG. 2, the optical resonance layer 2 may be comprised of only a first layer 21. Materials constituting the first layer 21 are the same described above.

In the embodiment illustrated in FIG. 2, the optical resonance occurs between a bottom surface of the second electrode layer 43, which is a reflection interface between second electrode layer 43 and light-emitting layer 42, and an interface between the first layer 21 and the substrate 1.

A resonance thickness is designated by t3. t3 can be obtained from the following equation:

$$t3=(n\lambda)/2,$$

wherein t3 is a distance from the bottom surface of the second electrode layer 43 to a bottom surface of the first layer 21;

n is a positive integer; and $\lambda$ is a wavelength of light emitted from a light-emitting layer 42.

t3 may be controlled by adjusting a thickness of at least one of the first layer 21 and the interlayer 3.

In the embodiments illustrated in FIGS. 1 and 2, bottom emission type organic light-emitting devices in which light is emitted in a direction to the substrate 1 are explained, but the present invention is not limited thereto.

Figure 3:
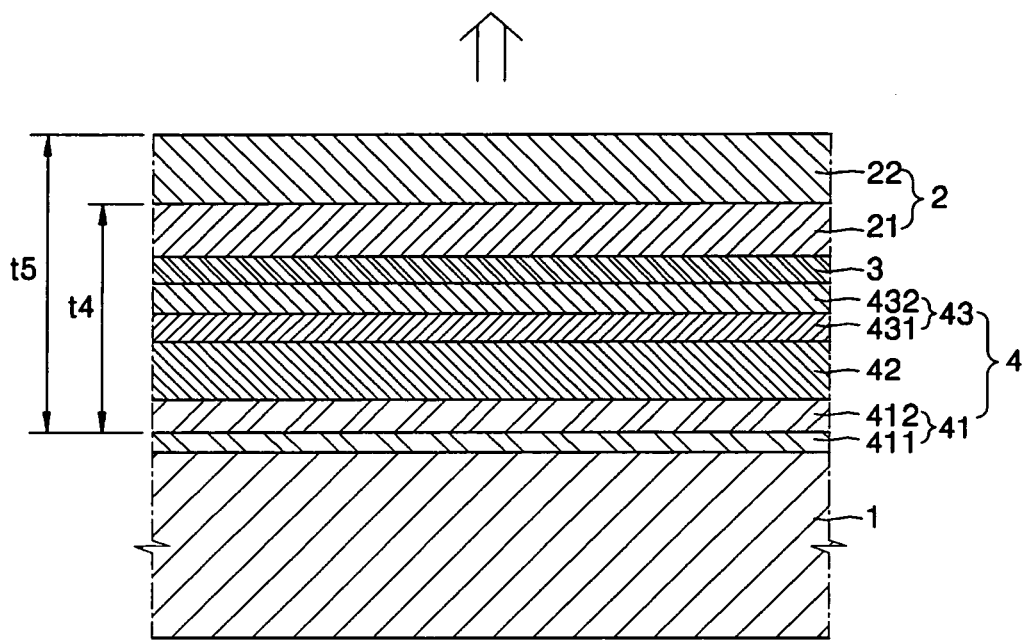
FIG. 3 shows a schematic cross-sectional view of a top emission type organic light-emitting device according to still another embodiment of the present invention.

FIG. 3 shows a schematic cross-sectional view of a top emission type organic light-emitting device according to another embodiment of the present invention.

Referring to FIG. 3, an optical resonance layer 2 comprises a first layer 21 and a second layer 22 as in FIG. 1. Unlike the embodiment illustrated in FIG. 1, a light-emitting diode 4 is formed on a substrate 1, an interlayer 3 is formed on the light-emitting diode 4, and the first layer 21 and the second layer 22 are sequentially formed on the interlayer 3.

A first electrode 41 of the light-emitting diode 4 comprises a first reflective electrode 411 and a first transparent electrode 412. The first reflective electrode 411 may be made of Ag, Mg, Al, Pt, Pd, Au, Ni, Nd, Ir, Cr, or any compounds thereof. The first transparent electrode 412 may be made of a material having a high work function, such as ITO, IZO, ZnO, or $In_2O_3$.

A second electrode layer 43 may be a transparent electrode and may comprise a second metal electrode 431 which has a low work function and a second transparent electrode 432 formed on the second metal electrode 431. The second metal electrode 431 may be made of Li, Ca, LiF/Ca, LiF/Al, Al, Mg, or any compounds thereof. The second transparent electrode 432 may be made of ITO, IZO, ZnO, or $In_2O_3$.

Thus, the optical resonance is generated between a top surface of the first reflective electrode 411 and an interface, the interface being between the first layer 21 and the second layer 22, and further, between the top surface of the first reflective electrode 411 and a top surface of the second layer 22.

Referring to FIG. 3, resonance thicknesses are designated by t4 and t5. t4 and t5 can be obtained from the following equations:

$$t4=(n\lambda)/2,$$

$$t5=(2n+1)\lambda/4,$$

wherein t4 is a distance from the top surface of the first reflective electrode 411 to the interface between the first layer 21 and the second layer 22;

t5 is a distance from the top surface of the first reflective electrode 411 to the top surface of the second layer 22;

n is a positive integer; and $\lambda$ is a wavelength of light emitted from the light-emitting layer 42.

t4 may be controlled by adjusting a thickness of at least one of the first layer 21 and the interlayer 3, and t5 may be controlled by adjusting a thickness of the second layer 22.

Figure 4:
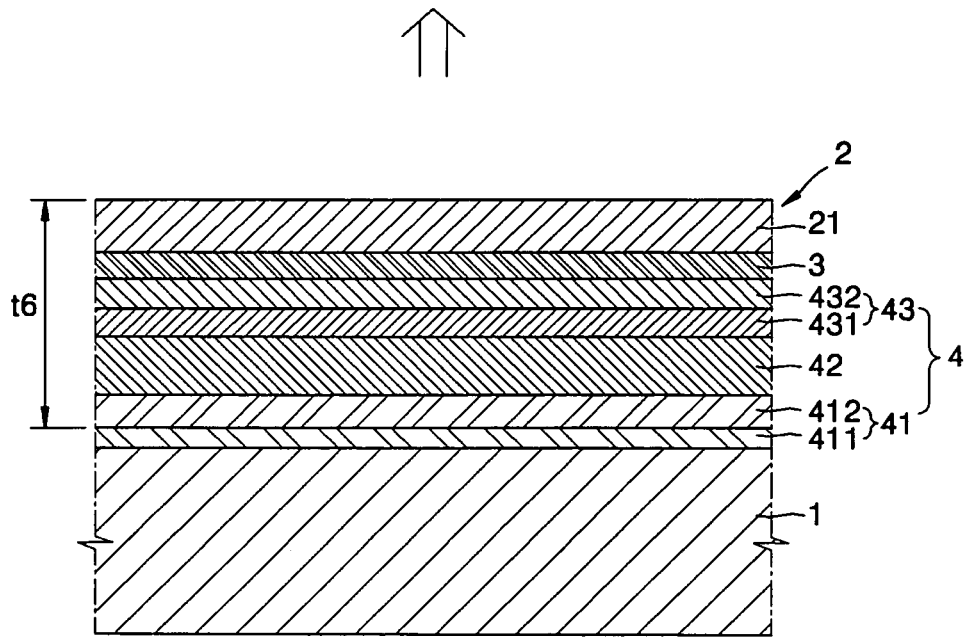
FIG. 4 shows a schematic cross-sectional view of a top emission type organic light-emitting device according to yet another embodiment of the present invention.

FIG. 4 shows a schematic cross-sectional view of a top emission type organic light-emitting device according to another embodiment of the present invention.

Referring to FIG. 4, an optical resonance layer 2 is comprised of only a first layer 21 as in FIG. 2. Other constitutional elements than the optical resonance layer 2 are the same as in the embodiment in FIG. 3 and detailed description thereof will not be repeated.

In the embodiment illustrated in FIG. 4, the optical resonance occurs between the top surface of the first reflective electrode 411 and the top surface of the first layer 21.

A resonance thickness is designated by t6. t6 can be obtained from the following equation:

$$t6=(n\lambda)/2,$$

wherein t6 is a distance from the top surface of the first reflective electrode 411 to the top surface of the first layer 21;

n is a positive integer; and

λ is a wavelength of light emitted from a light-emitting layer 42.

t6 may be controlled by adjusting a thickness of at least one of the first layer 21 and the interlayer 3.

Figure 5:
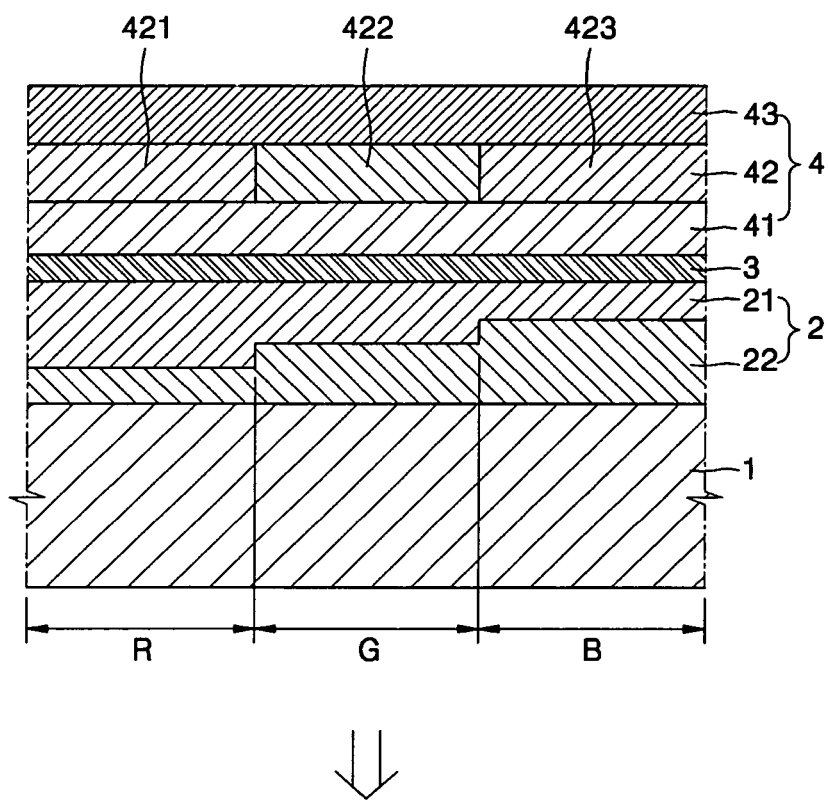
FIG. 5 shows the organic light-emitting device illustrated in FIG. 1, in which an organic resonance layer has a different thickness for each of red, green, and blue pixels.

FIG. 5 shows the organic light-emitting device illustrated in FIG. 1, in which a light-emitting layer 42 comprises a red light-emitting layer 421, a green light-emitting layer 422, and a blue light-emitting layer 423, thus forming a red pixel (R), a green pixel (G), and a blue pixel (B).

Since the light-emitting region of each R, G, B pixels has a different emission spectrum and wavelength, a resonance thickness which can maximize efficiency of each pixel can be selected accordingly. Thus, in order to maximize the light-emitting efficiency of all R, G, B pixels, a first layer 21 and a second layer 22 must be formed to have different thicknesses according to the color of the pixel such that a resonance thickness which can provide the maximum light-emitting efficiency is formed for each pixel.

To accomplish this, the second layer 22, which can be made of $Si_3N_4$, is formed on a substrate 1 using, for example, plasma enhanced chemical vapor deposition (PECVD) and step differences are formed on the second layer 22 using a conventional dry etching using a photoresist as an etch mask, such that the second layer 22 has different thicknesses corresponding to each of the R, G, B pixels. Then, the surface can be planarized by spin coating the first layer 21 on the second layer 22, thus obtaining the structure illustrated in FIG. 5.

Figure 6:
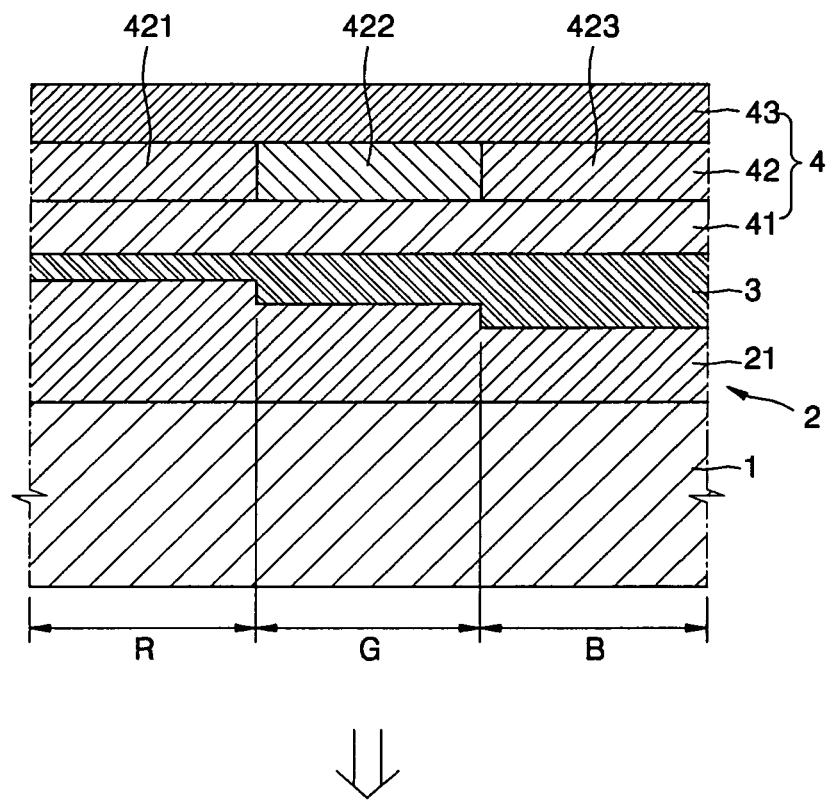
FIG. 6 shows the organic light-emitting device illustrated in FIG. 2, in which an organic resonance layer has a different thickness for each of red, green, and blue pixels.

FIG. 6 shows the organic light-emitting device illustrated in FIG. 2, in which a light-emitting layer 42 comprises a red light-emitting layer 421, a green light-emitting layer 422, and a blue light-emitting layer 423, thus forming a red pixel (R), a green pixel (G), and a blue pixel (B).

Since each light-emitting region of R, G, B pixels has a different emission spectrum and wavelength, a resonance thickness which can maximize efficiency of each pixel can be selected accordingly. Thus, in order to maximize the light-emitting efficiency of all R, G, B pixels, a first layer 21 must be formed to have different thicknesses according to the color of the pixel such that a resonance thickness which can provide the maximum light-emitting efficiency is formed for each pixel.

To accomplish this, the first layer 21 is formed on a substrate 1 and step differences are formed on the first layer 21 such that the first layer 21 has different thicknesses corresponding to each of the R, G, B pixels. Then, the surface can be planarized by forming an interlayer 3.

The different thicknesses of the first layer 21 and second layer 22 for each pixel as illustrated in FIGS. 6 and 5, respectively, can be applied to the top emission type light-emitting devices, for example, illustrated in FIGS. 3 and 4, although these embodiments are not shown in the drawings.

Figure 7:
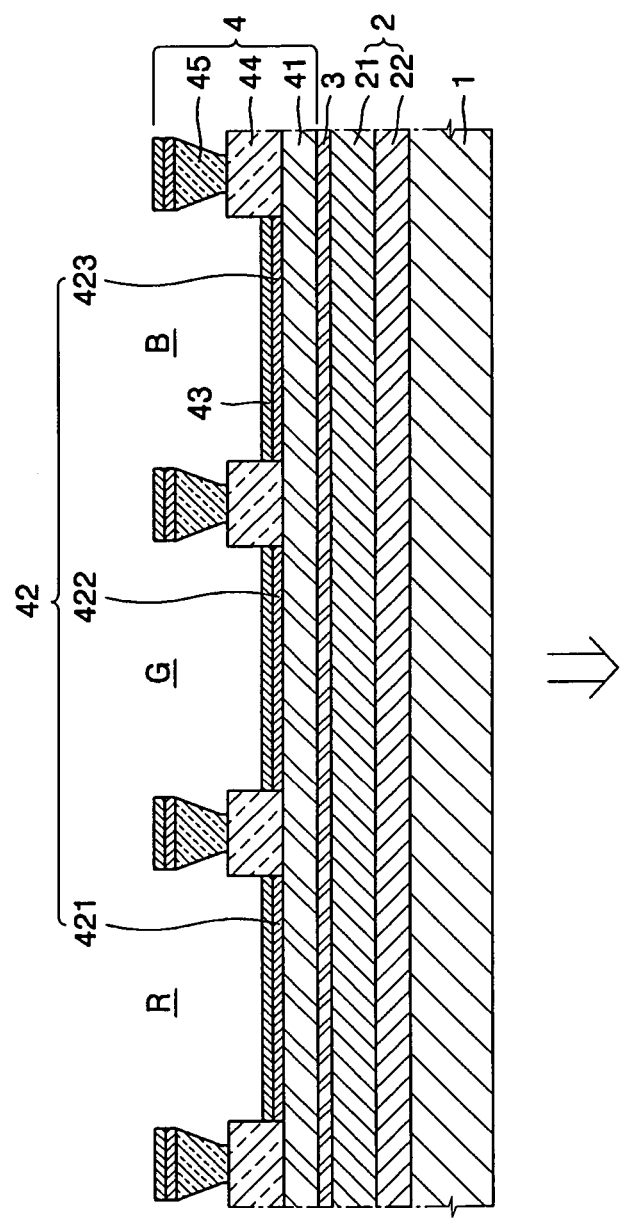
FIG. 7 shows a schematic cross-sectional view of bottom emission type, passive matrix (PM) organic light-emitting device according to a further embodiment of the present invention.
Figure 8:
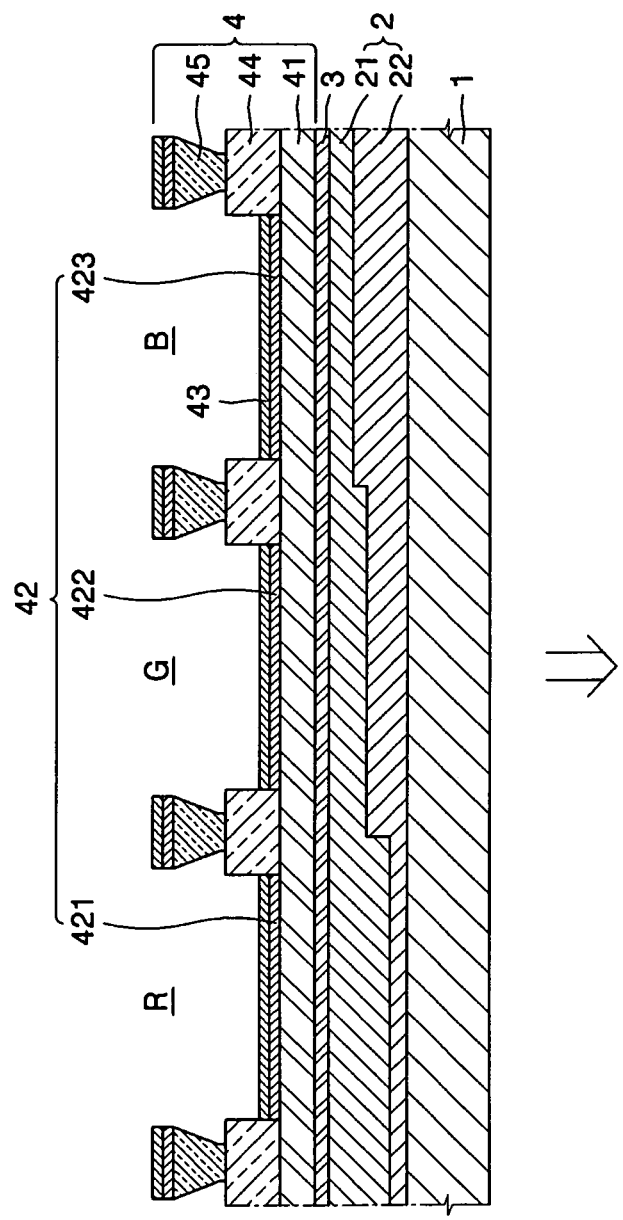
FIG. 8 shows a schematic cross-sectional view of bottom emission type, passive matrix (PM) organic light-emitting device according to a further embodiment of the present invention.

FIGS. 7 and 8 show schematic cross-sectional views of bottom emission type, passive matrix (PM) organic light-emitting devices according to further embodiments of the present invention.

Referring to FIG. 7, an optical resonance layer 2 comprises a first layer 21 and a second layer 22, and light emitted from a light-emitting diode 4 is emitted in the direction of the substrate 1. The optical resonance layer 2 is interposed between the substrate 1 and the light-emitting diode 4. An interlayer 3 is interposed between the optical resonance layer 2 and the light-emitting diode 4.

The first electrode layer 41 is arranged in strips on the interlayer 3 and an internal insulating layer 44 is formed on the first electrode layer 41 such that the internal insulating layer 44 divides the first electrode layer 41 into lattice form. A separator 45 is formed perpendicular to the first electrode layer 41 and can pattern a light-emitting layer 42 and a second electrode layer 43. Due to the separator 45, the light-emitting layer 42 and the second electrode layer 43 can be patterned to be perpendicular to the first electrode layer 41.

As illustrated in FIG. 7, the optical resonance layer 2 has an identical thickness for each pixel. However, as illustrated in FIG. 8, the optical resonance layer 2 has a different thickness for each R, G, B pixel. Thicknesses for each pixel can be selected and manufactured to achieve maximum light-emitting efficiency as described above in the description of FIG. 5, and will not be described again here.

Figure 9:
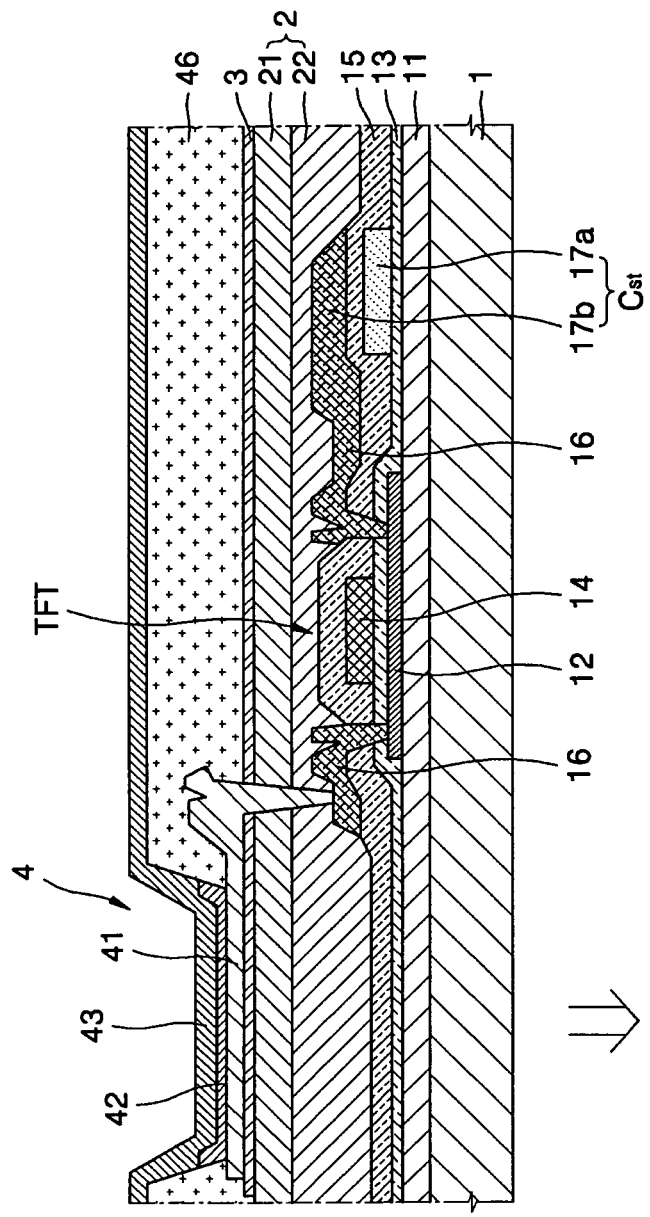
FIG. 9 shows a schematic cross-sectional view of a bottom emission type, active matrix (AM) organic light-emitting device according to a further embodiment of the present invention.
Figure 10:
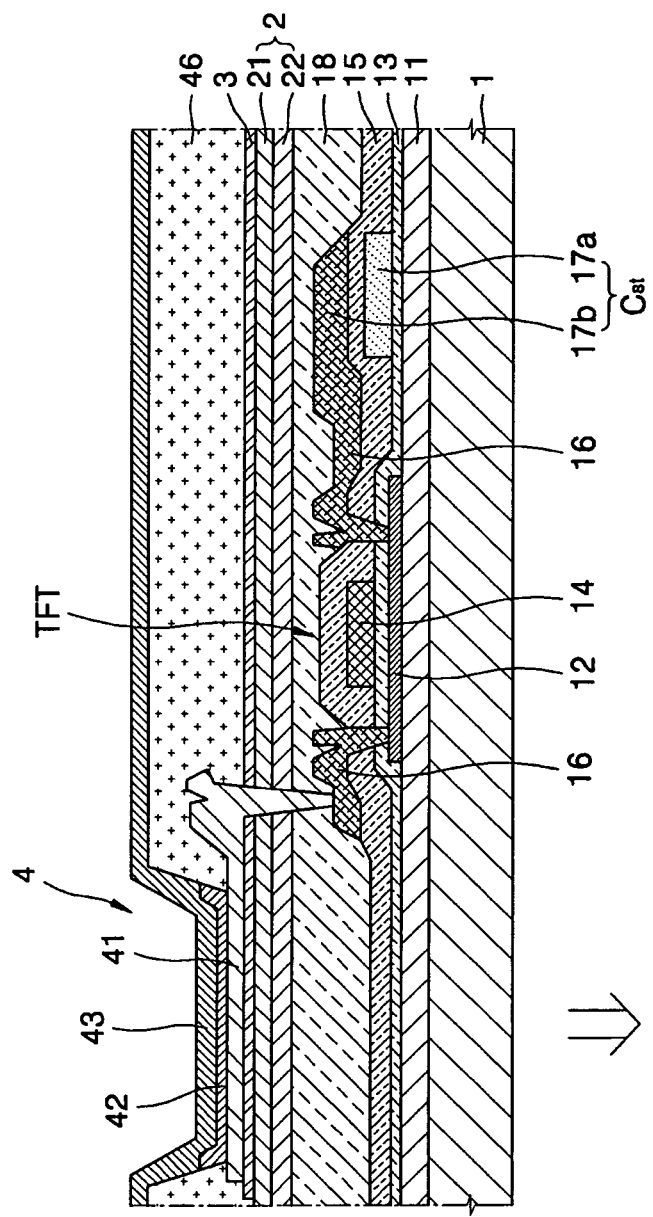
FIG. 10 shows a schematic cross-sectional view of a bottom emission type, active matrix (AM) organic light-emitting device according to a further embodiment of the present invention.

FIGS. 9 and 10 show schematic cross-sectional views of bottom emission type, active matrix (AM) organic light-emitting devices according to further embodiments of the present invention.

As illustrated in FIG. 9, light is emitted in the direction of substrate 1 and the substrate 1 has at least one Thin Film Transistor (TFT) for each pixel.

Specifically, a buffer layer 11 is formed on the substrate 1 and a TFT and a capacitor Cst are formed on the buffer layer 11.

An active semiconductor layer 12 having a predetermined pattern is formed on the buffer layer 11. A gate insulating layer 13 made of $SiO_2$ or $SiN_x$ is formed on the active layer 12 and a gate electrode 14 is formed on a portion of the gate insulating layer 13. The gate electrode 14 is connected to a gate line (not shown) which applies a TFT on/off signal to the gate electrode 14. An interlayer insulating layer 15 is formed on the gate electrode 14 and source/drain electrodes 16 are respectively formed to contact source/drain regions of the active layer 12 through contact holes. One electrode 17a of the capacitor Cst is formed simultaneously with the gate electrode 14 and the other electrode 17b of the capacitor Cst is formed simultaneously with source/drain electrodes 16. The structures of the TFT and the capacitor Cst can be modified in various ways.

The TFT and the capacitor Cst are protected by covering them with a passivation layer. As illustrated in FIG. 9, a second layer 22 of an optical resonance layer 2 functions as the passivation layer. Specifically, the second layer 22 made of $Si_3N_4$ may be formed using PECVD.

A first layer 21 is formed on the second layer 22. The first layer 21 is made of a is material having a high light transmittance among the above-mentioned low refractive index materials. Then, an interlayer 3 is formed to cover the first layer 21.

A first electrode layer 41, which functions as an anode electrode, is formed on the interlayer 3 and a pixel define layer 46 made of an organic material is formed to cover the first electrode layer 41. Then, a opening is formed in the pixel define layer 46 and a light-emitting layer 42 of the light-emitting diode 4 is formed in a region defined by the opening. Next, a second electrode layer 43 is formed to cover the pixels.

In such an AM type light-emitting device, the effects of the present invention described above can be obtained by forming the optical resonance layer 2 and the interlayer 3 on the TFT.

The structure of the AM type light-emitting device can be modified in various ways. For example, as illustrated in FIG. 10, as a passivation layer 18, a layer of low refractive index methylsilsesquioxane (MSQ) is used in place of the second layer 22 illustrated in FIG. 9. In this case, the passivation layer 18 may be covered with a second layer 22 and a first layer 21, and an interlayer 3 may be sequentially formed on the first layer 21. The other constitutional elements are the same described with respect to FIG. 9.

Figure 11:
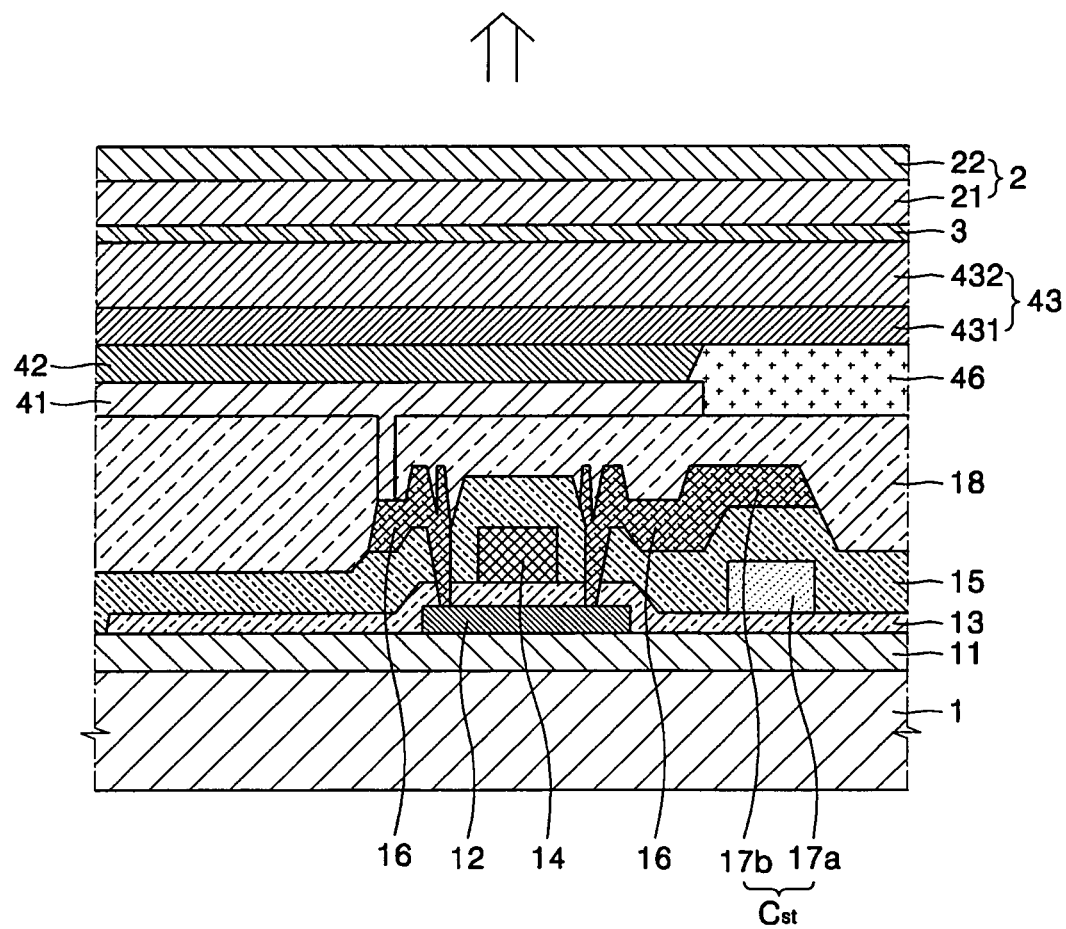
FIG. 11 shows a schematic cross-sectional view of top emission type, AM organic light-emitting device according to a further embodiment of the present invention.

FIG. 11 shows a schematic cross-sectional view of top emission type AM organic light-emitting device according to a further embodiment of the present invention;

As illustrated in FIG. 11, light is emitted in a direction away from substrate 1. The structures of the TFT and capacitor Cst are the same as illustrated in FIG. 10 and described above.

A passivation layer 18 is formed on the TFT and the capacitor to planarize the surface. The passivation layer 18 may have a structure of a single- or multi-layer made of an inorganic, organic material, or combination thereof.

A first electrode layer 41, which is reflective type and has a predetermined pattern, is formed on the passivation layer 18 and a pixel define layer 46 is formed on the passivation layer 18 to cover an edge of the first electrode layer 41.

Then, a light-emitting layer 42 is formed through an opening of the pixel define layer 46 and a second electrode layer 43 is formed to cover the light-emitting layer 42 and the pixel define layer 46. The second electrode layer 43 may be a transparent electrode, as described above, and may comprise a second metal electrode 431 which has a low work function and a second transparent electrode 432 formed on the second metal electrode 431.

An interlayer 3 and an optical resonance layer 2 are sequentially formed on the second electrode layer 43.

In such a structure, the interlayer 3 and the optical resonance layer 2 also function as a passivation layer for the light-emitting device 4.

In the PM and AM type devices according to the embodiments illustrated in FIGS. 7 through 11, the optical resonance layer 2 comprises both the first layer 21 and the second layer 22, but the present invention is not limited these structures. The structures in which the optical resonance layer 2 is composed of only the first layer 21 are included in the scope of the present invention.

In the embodiments illustrated in FIGS. 9 through 11, only single pixels are illustrated. The structure in which at least one of the optical resonance layer 2 and the interlayer 3 has different thicknesses for each pixel, as illustrated in FIG. 1, can be applied to a full color display in which each pixel has a different color.

Hereinafter, the present invention will be described in more detail with reference to the following examples.

EXAMPLE 1

A test cell having 4 light-emitting regions each having a size of 2 mm×3 mm was prepared for estimation. First, a glass substrate was cleaned and NPS having a pore size of 10 nm or less was coated on the glass substrate.

Then, the coated substrate was heat-treated in an oven at 400° C. for 1 hour, thereby forming a first layer 21. The obtained first layer 21 had a refractive index of 1.2 and the thicknesses of the first layer 21 for the four regions was 0, 100, 230, and 300 nm. Then, an interlayer 3 made of $SiO_2$ was deposited to a thickness of 20 nm using sputtering. The interlayer 3 had a refractive index of 1.45. When a porous material is used as a material of the first layer 21, the porous material typically absorbs moisture from the atmosphere, which deteriorates the lifetime of the organic light-emitting device. Thus, prior to depositing $SiO_2$, the substrate was baked in a deposition chamber at 150° C. for 10 minutes to completely remove the absorbed moisture from the first layer 21. The interlayer 3 comprised of deposited $SiO_2$ functions as a passivation layer which prevents moisture from penetrating into the porous material. After forming the interlayer 3, a first electrode layer 41 made of ITO was formed to a thickness of 80 nm by sputtering. Next, light-emitting regions were formed using a conventional pixel patterning process and polyimide, and then, an organic light-emitting layer 42 (made of a green fluorescent light-emitting organic material) which is a constitutional element of an OLED was deposited on the light-emitting regions using a depositor and a second electrode layer 43 which is a metal cathode electrode was formed on the light-emitting layer 42. Then, a surface of the resultant structure was encapsulated with a glass substrate to obtain a test cell element. The obtained test cell had a similar structure to the embodiment illustrated in FIG. 2.

Figure 12:
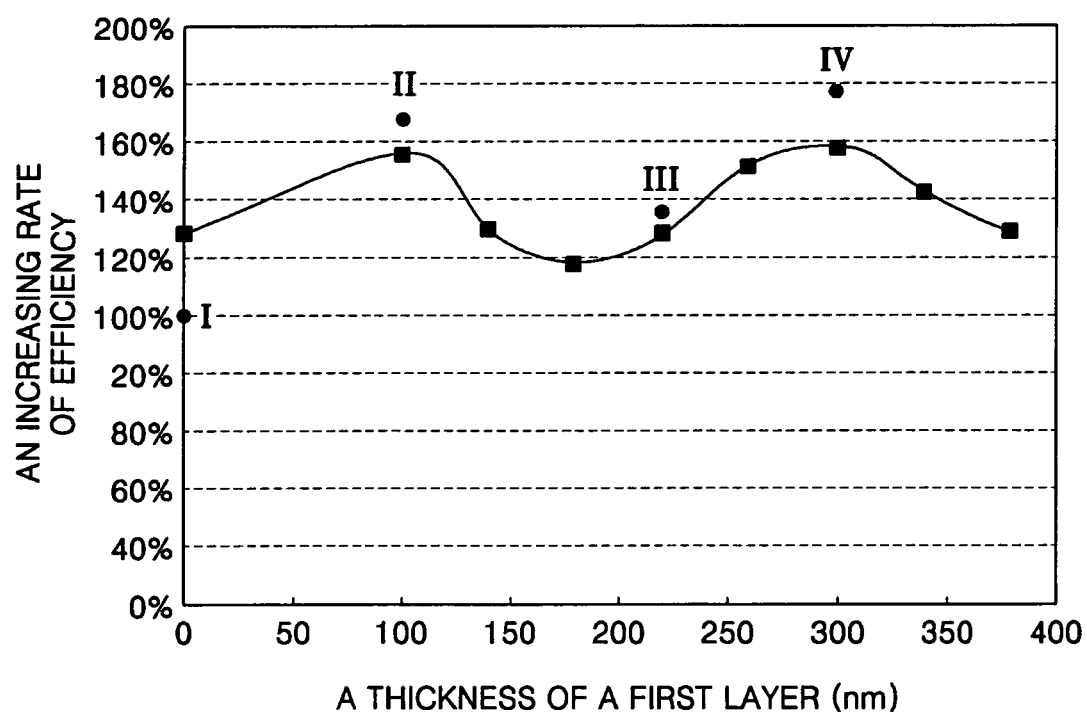
FIG. 12 shows a graph of a thickness of a first layer vs. an increasing rate of efficiency in the organic light-emitting device obtained in Example 1.

FIG. 12 shows a graph of a thickness of a first layer vs. rate of efficiency in the organic light-emitting device obtained in Example 1.

In FIG. 12, the circular points represent values determined using the four light-emitting regions in the cell prepared in Example 1. The curved line and square data points represent a simulation result which reflects the equation for obtaining the efficiency in light-emission given a resonance thickness t3, illustrated in FIG. 2.

Data point I with a first layer 21 thickness of 0 nm in FIG. 12 corresponds to a normal structure without the first layer 21 or the interlayer 3 (Comparative Example (I)). The simulation results were obtained by changing only the thickness of the first layer 21, but not changing the thickness of the interlayer 3, which was 20 nm. Thus, the calculated rate of efficiency exceeds 120% of the efficiency of the Comparative Example (I), which has neither the first layer 21 nor the interlayer 3.

Front-surface brightnesses of the device were measured while driving the device at a constant current density of 30 mA/cm² and light-emitting efficiencies were estimated. As a result, in the structures (II), (III), and (IV) of the device according to an embodiment of the present invention, the efficiency was increased to its maximum 1.75 times in the conditions of Example 1 and it was also confirmed that the structures (II), (III), and (IV) increased the efficiency of the organic light-emitting device.

EXAMPLE 2

In this Example, a light-emitting device was manufactured in which the optical resonance layer 2 comprised the first layer 21 and the second layer 22 and its basic structure was the same as the embodiment illustrated in FIG. 1.

In this structure, a test cell was prepared in the same manner as in Example 1, except that a second layer 22 made of Si$_3$N$_4$ was formed on a substrate 1 using PECVD prior to forming the first layer 21. The formed second layer 22 had a refractive index of 2.0.

Figure 13:
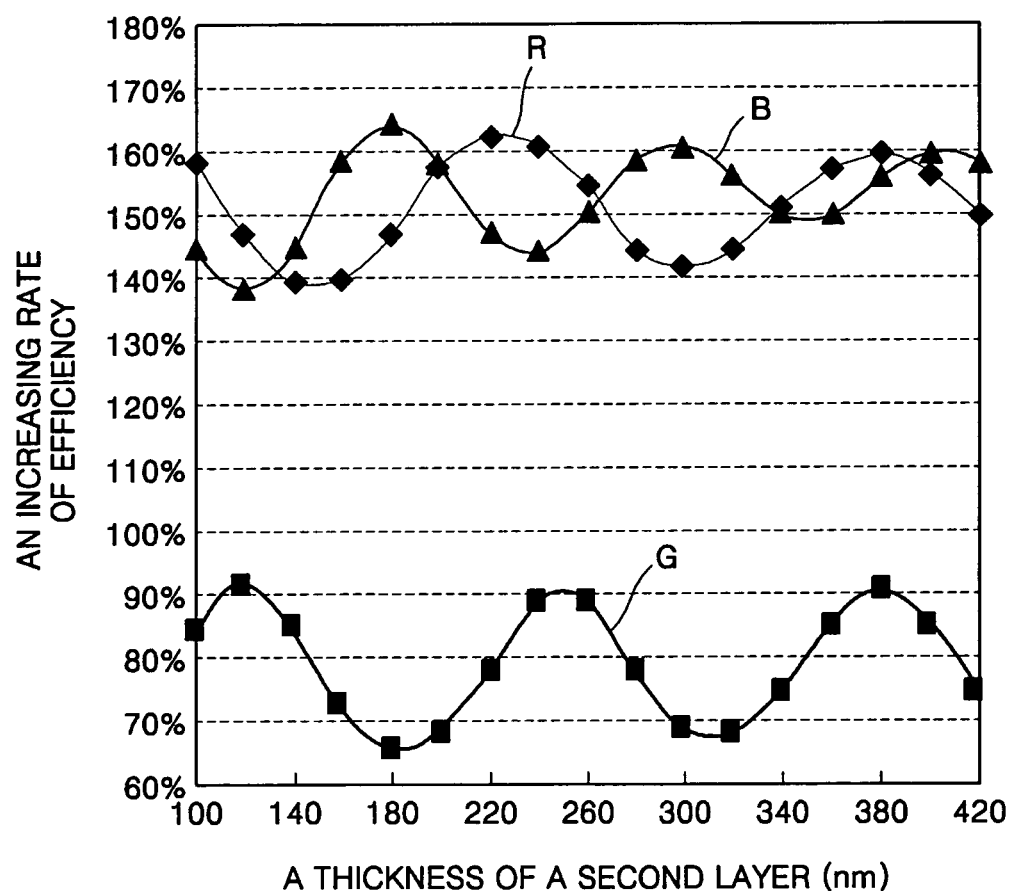
FIG. 13 shows a graph of a thickness of a second layer vs. an increasing rate of efficiency in the organic light-emitting obtained in Example 2.

FIG. 13 shows a graph of a thickness of a second layer vs. rate of efficiency in the organic light-emitting obtained in Example 2. The three curves represent simulation results of the rate of efficiency when thicknesses of a first electrode layer 41, an interlayer 3, and the first layer 21 were set to 140 nm, 20 nm, and 340 nm, respectively, and a thickness of the second layer 22 was varied from 100 nm to 400 nm.

EXAMPLE 3

Figure 14:
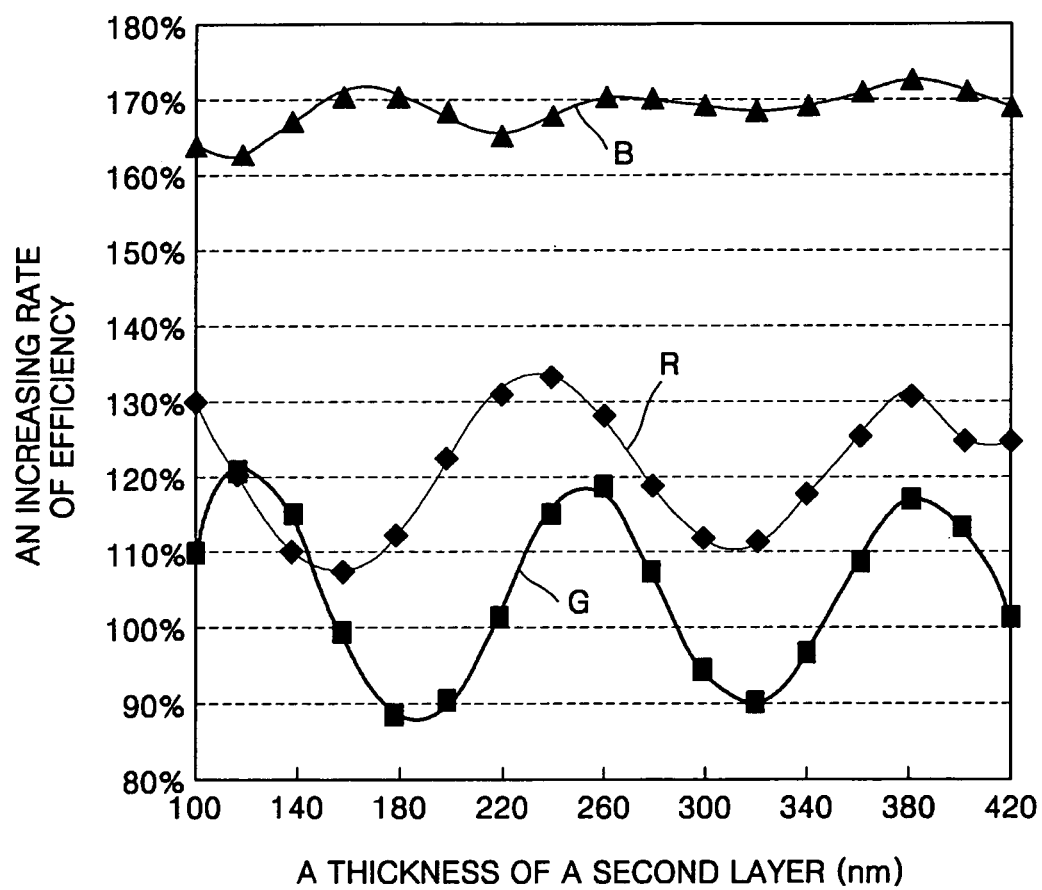
FIG. 14 shows a graph of a thickness of a second layer vs. an increasing rate of efficiency in the organic light-emitting obtained in Example 3.

A light-emitting device with a similar structure as the device prepared in Example 2 was obtained. However, in Example 3, the thicknesses of a first electrode layer 41, an interlayer 3, and the first layer 21 were set to 160 nm, 20 nm, and 300 nm, respectively, and the thickness of the second layer 22 was varied from 100 nm to 400 nm. The three curves shown in FIG. 14 represent simulation results of the rate of efficiency versus the thickness of the second layer.

In Example 2, as illustrated in FIG. 13, the efficiency greatly increases in the Red (R) and Blue (B) pixels. In Example 3, as illustrated in FIG. 14, the efficiency increases in the R and B pixels at all thicknesses of the second layer 22, and efficiency increases for the G pixel at a majority of the simulated thicknesses Color coordinates for the device obtained in Example 2 (FIG. 13) in which the second layer 22 has a thickness of 260 nm and for the device used as the Comparative Example (I) (FIG. 12) were estimated and the results are shown in Table 1.

TABLE 1

|  | Color coordinate of Example 2 (x, y) | Color coordinate of Comparative Example (I) (x, y) |
| --- | --- | --- |
| Red | 0.665, 0.334 | 0.647, 0.352 |
| Blue | 0.173, 0.300 | 0.172, 0.278 |
| Green | 0.316, 0.635 | 0.297, 0.652 |

It was confirmed from Table 1 that there is no great difference between the color coordinates of Example 2 and Comparative Example (I).

As described above, the present invention is not limited to organic and inorganic light-emitting devices, but can be applied to other flat panel displays using LCDs or electron emitting apparatuses, such as light-emitting diodes.

According to the present invention, the light-emitting device has the following advantages.

First, light emitted from a light-emitting diode can be amplified by forming an optical resonance layer with a simple structure, thereby increasing light coupling efficiency.

Second, a resonance structure can be produced in a simpler manner and a total manufacturing process can be more simplified.

Third, brightness can be increased due to the optical resonance effect without increasing a loss of a view angle.

Fourth, light-emitting efficiency can be increased.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light-emitting device comprising:
   a substrate;
   a light-emitting diode arranged on the substrate;
   an interlayer arranged between the substrate and the light-emitting diode; and
   an optical resonance layer consisting of a first layer and a second layer arranged between the light-emitting diode and the substrate,
   wherein an uppermost surface of the first layer directly contacts the interlayer, a lowermost surface of the second layer directly contacts the substrate, and a lowermost surface of the first layer directly contacts an uppermost surface of the second layer, the optical resonance layer to induce resonance of light emitted from the light-emitting diode, and
   wherein a refractive index of the second layer is higher than that of the first layer.

2. The light-emitting device of claim 1, wherein the second layer has a higher refractive index than the first layer by 0.2 or more.

3. The light-emitting device of claim 1, wherein the first layer has a refractive index in the range of 1 to 1.6.

4. The light-emitting device of claim 1, wherein the first layer comprises nano porous silica, siloxane, magnesium fluoride, calcium fluoride, Teflon, silica aero gel, or silicon oxide.

5. The light-emitting device of claim 1, wherein the second layer has a refractive index in the range of 1.6 to 2.3.

6. The light-emitting device of claim 1, wherein the second layer comprises silicon nitride, titanium oxide, hafnium dioxide, niobium oxide, tantalum oxide, antimony oxide, synthetic polymer, or benzocylobutene (BCB).

7. The light-emitting device of claim 1, wherein the interlayer is composed of a denser material than the first layer.

8. The light-emitting device of claim 1, wherein the interlayer has a refractive index in the range of 1.3 to 2.3.

9. The light-emitting device of claim 1, wherein the interlayer comprises Ormocer, silicon oxide, benzocylobutene (BCB), or silicon nitride.

10. The light-emitting device of claim 1, wherein:
    the light-emitting diode comprises a pair of electrodes opposing each other and a light-emitting layer arranged between the electrodes,
    one electrode of the pair of electrodes comprises a reflective layer that reflects light emitted from the light-emitting layer, and
    the optical resonance layer opposes the reflective layer with the light-emitting layer arranged therebetween.

11. The light-emitting device of claim 10, satisfying equation 4:

$$t4 = (n\lambda)/2 \qquad (4)$$

wherein t4 is a distance from a reflection interface of the reflective layer to an interface between the first layer and the second layer;

n is a positive integer; and

λ is a wavelength of light emitted from the light-emitting layer.

12. The light-emitting device of claim 11, wherein t4 is controlled by adjusting a thickness of at least one of the first layer and the interlayer.

13. The light-emitting device of claim 10, satisfying equation 5:

$$t5 = (2n+1)\lambda/4 \qquad (5)$$

wherein
t5 is a distance from a reflection interface of the reflective layer to an outer surface of the second layer;
n is a positive integer; and
$\lambda$, is a wavelength of light emitted from the light-emitting layer.

14. The light-emitting device of claim 13, wherein t5 is controlled by adjusting a thickness of the second layer.

15. The light-emitting device of claim 1, wherein the light-emitting diode is an organic light-emitting diode.

* * * * *

UNITED STATES PATENT AND TRADEMARK OFFICE
CERTIFICATE OF CORRECTION

PATENT NO. : 8,525,154 B2  Page 1 of 1
APPLICATION NO. : 11/269575
DATED : September 3, 2013
INVENTOR(S) : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1615 days.

Signed and Sealed this
Twenty-third Day of May, 2017

Michelle K. Lee
*Director of the United States Patent and Trademark Office*